United States Patent [19]

Hijikata et al.

[11] Patent Number: 4,946,537

[45] Date of Patent: Aug. 7, 1990

[54] PLASMA REACTOR

[75] Inventors: Isamu Hijikata; Akira Uehara, both of Kanagawa, Japan

[73] Assignee: Tokyo Ohka Kogyo Co., Ltd., Kanagawa, Japan

[21] Appl. No.: 371,743

[22] Filed: Jun. 26, 1989

[30] Foreign Application Priority Data

Jul. 12, 1988 [JP] Japan .................................. 63-173516

[51] Int. Cl.⁵ ...................... H01L 21/306; B44C 1/22; C03C 15/00; C03C 25/06
[52] U.S. Cl. .................................... 156/345; 156/643; 156/646; 204/298.37; 204/298.38
[58] Field of Search ........................ 204/192.32, 192.35, 204/192.37, 298.37, 298.38; 118/728, 50.1, 620, 623; 427/38, 39; 156/345, 643, 646

[56] References Cited

U.S. PATENT DOCUMENTS

| | | | |
|---|---|---|---|
| 4,559,100 | 12/1985 | Ninomiya et al. | 156/643 X |
| 4,668,338 | 5/1987 | Maydan et al. | 156/643 |
| 4,738,761 | 4/1988 | Bobbio et al. | 204/298.37 |
| 4,829,215 | 5/1989 | Kim et al. | 204/298.37 |

FOREIGN PATENT DOCUMENTS

| | | |
|---|---|---|
| 50-9545 | 4/1975 | Japan . |
| 53-34462 | 9/1978 | Japan . |
| 53-44795 | 12/1978 | Japan . |
| 59-39508 | 9/1984 | Japan . |

Primary Examiner—William A. Powell
Attorney, Agent, or Firm—Irving M. Weiner; Joseph P. Carrier; Pamela S. Burt

[57] ABSTRACT

A plasma reactor includes a chamber, a specimen such as a wafer or the like supported in the chamber, a device for generating a plasma in the chamber, and at least one electromagnetic coil disposed coaxially around the chamber. The specimen is supported parallel to a magnetic field generated by the electromagnetic coil. High-density and high-energy charged particles in the plasma collide perpendicularly with the surface of the specimen to treat the specimen by way of etching or the like.

9 Claims, 2 Drawing Sheets

PLASMA REACTOR

BACKGROUND OF THE INVENTION

1. Field of the Invention:

The present invention relates to a plasma reactor for treating an object such as a semiconductor wafer or the like through an etching process or the like.

2. Description of the Relevant Art:

There are known various apparatus for treating objects in different ways through plasma reaction as disclosed in Japanese Patent Publications Nos. 50-9545, 53-34462, 53-44795, and 59-39508, for example. In these known apparatus, a plasma is subjected to an electromagnetic field to generate a high density, high-energy plasma even in a low-gas-pressure region. An object can be etched, for example, in the thus generated plasma for anisotropic etching with less side etch or undercut.

The etching rate is higher and side etch or undercut is less with the disclosed apparatus than other conventional apparatus where no electromagnetic field is applied to the plasma. There is however a demand for apparatus which can treat objects at a higher etching rate and with less side etch.

SUMMARY OF THE INVENTION

It is an object of the present invention to provide a plasma reactor for treating an object efficiently.

According to the present invention, there is provided a plasma reactor comprising a chamber, means for generating a plasma in the chamber, means for generating a magnetic field in the chamber, and support means disposed in the chamber for supporting a specimen to be treated, parallel to the generated magnetic field.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
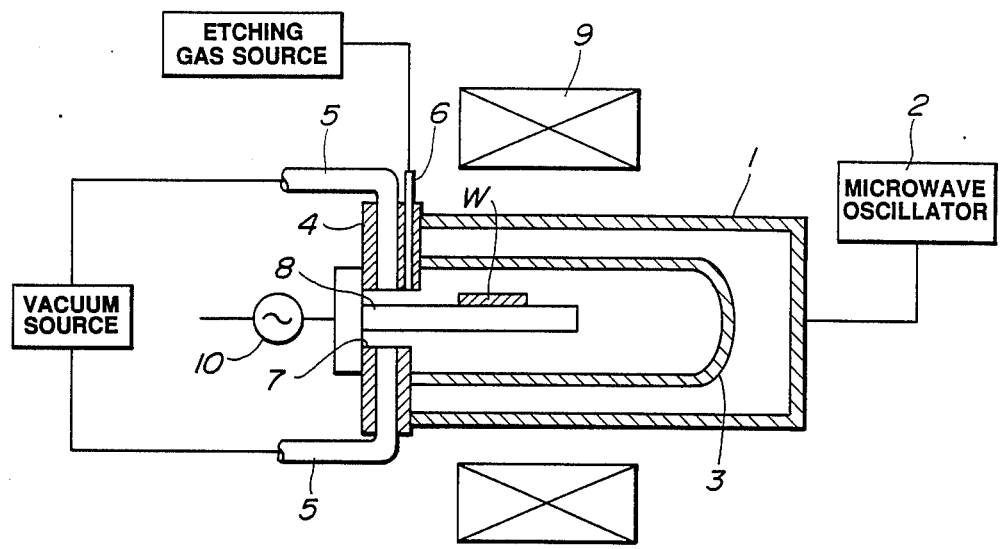
FIG. 1 is a cross-sectional view of a plasma reactor according to an embodiment of the present invention.

FIG. 1 shows in cross section a plasma reactor according to an embodiment of the present invention. The plasma reactor includes a chamber 3 made of synthetic quartz or the like and disposed in a waveguide 1 associated with a microwave oscillator 2 which generates a microwave having a frequency of 2.45 GHz. The waveguide 1 and the chamber 3 are closed on one side by a head 4 in which there are mounted a discharge pipe 5 connected to a vacuum source and a gas inlet pipe 6 connected to a reaction gas source. The head 4 has a through opening 7 through which a support 8 is horizontally movable into and out of the chamber 3. A specimen W such as a silicon wafer is placed on the support 8.

The support 8 is electrically connected to a high-frequency power supply 10 which produces electric energy having a frequency of 13.56 MHz. An electromagnetic coil 9 is disposed around the waveguide 1 in coaxial relation to the waveguide 1 and the chamber 3, such that a magnetic field generated in the chamber 3 by the electromagnetic coil 9 extends parallel to the specimen W on the support 8. As shown the support 8 and the workpiece W are disposed directly within the central opening of the electromagnetic coil 9.

Figure 2:
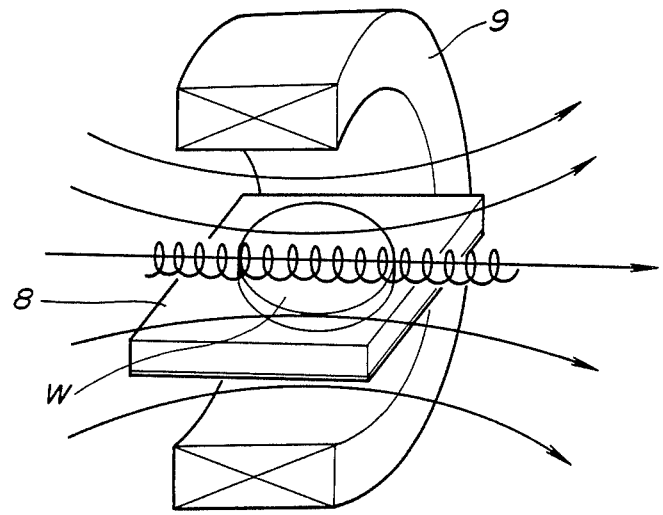
FIG. 2 is a fragmentary perspective view showing the manner in which the plasma reactor shown in FIG. 1 operates.

In operation, the chamber 3 is evacuated by the vacuum source through the discharge pipe 5 and a reaction gas such as an etching gas is introduced into the chamber 3 from the reaction gas source through the gas inlet pipe 6. The microwave oscillator 2 is energized to apply a microwave to the chamber 3 and the high-frequency power supply 10 is energized to apply high-frequency electric power to the support 8. At the same time, the electromagnetic coil 9 is energized to generate a static magnetic field in the chamber 3. Then, a high-density and high-energy plasma is generated in the chamber 3, and electrons spin about magnetic lines of force as shown in FIG. 2. The spinning motion of the electrons cause active electrons and ions in the plasma to collide perpendicularly to the surface of the specimen W for thereby etching the specimen W or depositing a film on the specimen W highly efficiently.

Figure 3:
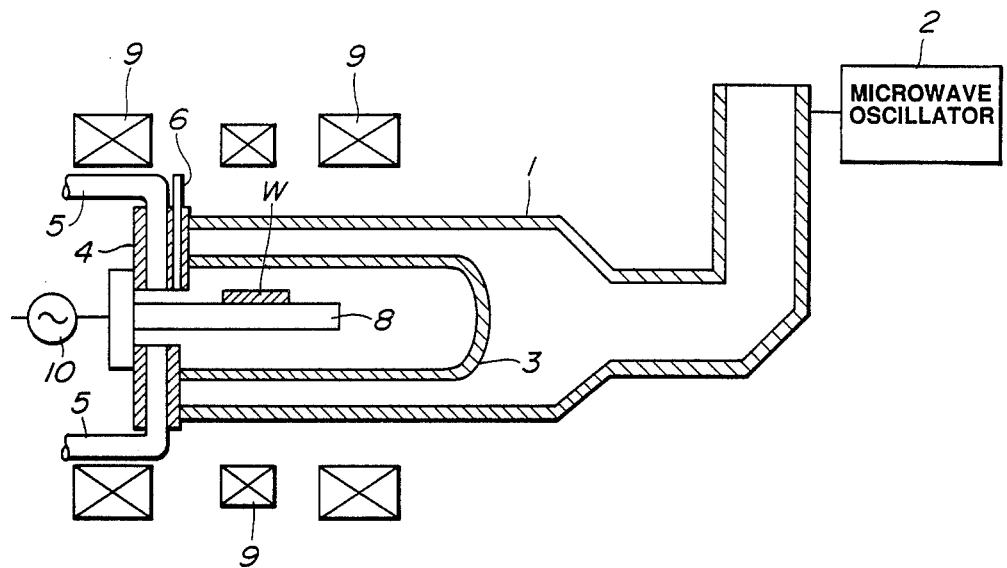
FIGS. 3 and 4 are cross-sectional views of plasma reactors according to other embodiments of the present invention.

FIG. 3 shows a plasma reactor according to another embodiment of the present invention. The plasma reactor shown in FIG. 3 includes three electromagnetic coils 9 disposed around a waveguide 1 for uniformly treating a specimen W placed on a support 8 in a chamber 3. The number of electromagnetic coils 9 may freely be selected.

Figure 4:
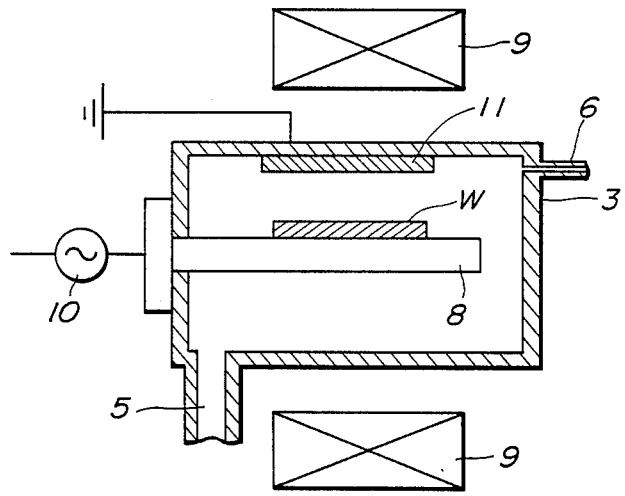

FIG. 4 illustrates a plasma reactor according to still another embodiment of the present invention. The plasma reactor shown in FIG. 4 employs no waveguide, but has an upper electrode 11 disposed in and attached to an upper wall of a chamber 3, the electrode 11 being grounded. A support 8 disposed in the chamber 3 serves as a lower electrode. A plasma is generated between the upper and lower electrodes 11, 8 in the chamber 3.

The plasma reactors shown in FIGS. 3 and 4 operate in substantially the same manner as the plasma reactor illustrated in FIGS. 1 and 2. Also, as again shown in FIGS. 3-4, the support 8 and the workpiece W are disposed directly within the central opening of an electromagnetic coil 9.

Table 1 below shows the results of experiments conducted on conventional plasma reactors and the plasma reactor shown in FIG. 1, and Table 2 below shows the results of experiments conducted on conventional plasma reactors and the plasma reactor illustrated in FIG. 4.

TABLE 1

|  | Without magnetic field | With magnetic field (not parallel) | With magnetic field (parallel: inventive example) |
| --- | --- | --- | --- |
| Rate of etching PolySi (Å/min.) | 197 | 707 | 924 |
| Rate of etching SiO2 (Å/min.) | 105 | 66 | 117 |

TABLE 1-continued

|  | Without magnetic field | With magnetic field (not parallel) | With magnetic field (parallel: inventive example) |
| --- | --- | --- | --- |
| Etched condition | Large side etch | Small side etch | No side etch |

The experiments were carried out under the following conditions:
Etching gas:
$SF_6$ (10SCCM)
F114 (20SCCM)
Microwave output: 200 W
High-frequency electric power: 100 W
Pressure: 8 m torr
Magnetic field: 800 gauss

TABLE 2

|  | Without magnetic field | With magnetic field (not parallel) | With magnetic field (parallel: inventive example) |
| --- | --- | --- | --- |
| Rate of Etching PolySi (Å/min.) | 103 | 465 | 710 |
| Rate of etching $SiO2$ (Å/min.) | 93 | 115 | 253 |
| Etched condition | Large side etch | Small side etch | No side etch |

The experiments were carried out under the following conditions:
Etching gas:
$SF_6$ (10SCCM)
F114 (20SCCM)
High-frequency electric power: 75 W
Pressure: 8 m torr
Magnetic field: 800 gauss Although there have been described what are at present considered to be the preferred embodiments of the present invention, it will be understood that the invention may be embodied in other specific forms without departing from the essential characteristics thereof. The present embodiments are therefore to be considered in all aspects as illustrative, and not restrictive. The scope of the invention is indicated by the appended claims rather than by the foregoing description.

We claim:

1. A plasma reactor comprising:
   a chamber;
   means for generating a plasma in said chamber;
   means for generating a magnetic field in said chamber;
   support means disposed in said chamber for supporting a specimen to be treated, parallel to the generated magnetic field;
   a waveguide which houses said chamber and associated with a microwave oscillator;
   a vacuum source and a reaction gas source which are connected to said chamber; and
   a high-frequency power supply connected to said support means.

2. A plasma reactor according to claim 1, wherein said means for generating a magnetic field comprises at least one electromagnetic coil.

3. A plasma reactor according to claim 2, wherein said electromagnetic coil is disposed coaxially around said chamber.

4. A plasma reactor according to claim 1, wherein said means for generating a plasma comprises an electrode connected to ground and an electrode connected to a high-frequency power supply, said electrodes being disposed in said chamber.

5. A plasma reactor comprising:
   a chamber;
   means for generating a plasma in said chamber;
   means for generating a static magnetic field in said chamber;
   said means for generating a static magnetic field comprises at least one electromagnetic coil; and
   support means disposed in said chamber for supporting a specimen to be treated parallel to the generated static magnetic field.

6. A plasma reactor according to claim 5, wherein said support means is adapted to supported a specimen to be treated directly within a central opening of said electromagnetic coil.

7. A plasma reactor according to claim 5, including:
   a head which closes an open side of said chamber, said head having a central opening defined therein; and
   said support means is adapted to move horizontally into and out of said chamber through said central opening of said head.

8. A plasma reactor according to claim 7, wherein said head also closes an open side of said waveguide.

9. Apparatus according to claim 7, further including a vacuum source and a reaction gas source which are connected to said chamber through said head.

* * * * *